United States Patent [19]

Kamata

[11] Patent Number: 4,698,656
[45] Date of Patent: Oct. 6, 1987

[54] OUTPUT DETECTOR OF A CHARGE COUPLED DEVICE

[75] Inventor: Takao Kamata, Tokyo, Japan

[73] Assignee: NEC Corporation, Tokyo, Japan

[21] Appl. No.: 833,289

[22] Filed: Feb. 27, 1986

[30] Foreign Application Priority Data

Feb. 27, 1985 [JP] Japan .................................. 60-37864

[51] Int. Cl.⁴ ...................... H01L 29/78; G11C 19/28
[52] U.S. Cl. .......................................... 357/24; 377/60
[58] Field of Search ...................... 357/24; 377/57–63

[56] References Cited

U.S. PATENT DOCUMENTS 3,971,003 7/1976 Kosonocky ................... 357/24 LR
4,321,584 3/1982 McNutt ............................... 377/58
4,389,615 6/1983 French et al. .................... 357/24 M Primary Examiner—Gene M. Munson
Attorney, Agent, or Firm—Burns, Doane, Swecker & Mathis

[57] ABSTRACT

The charge coupled device has a buried type charge transfer region and a charge-voltage converting region in a semiconductor substrate. The charge-voltage converting region is formed in the conductivity type opposite to the substrate and includes a high concentration portion at longitudinal center and low concentration portions at both sides of the high concentration portion.

4 Claims, 8 Drawing Figures

OUTPUT DETECTOR OF A CHARGE COUPLED DEVICE

BACKGROUND OF THE INVENTION

1. Field of the Invention

This invention relates to a charge coupled device, and more particularly to an output detector thereof for converting a quantity of charges transferred along a channel in the charge coupled device.

2. Description of the Prior Art

The charge coupled device in the prior art is formed on a silicon substrate. A channel region on the substrate is surrounded by a high impurity concentration field region. A plurality of gate electrodes are formed on the channel region via an insulating film to transfer charges along the channel region in response to an application of clock pulses to the gates. At the end of the series of the gates, a different conductivity region is formed to change a quantity of transferred charges into a voltage potential. The obtained voltage potential is too low to treat as an electrical signal. Therefore, the obtained voltage is applied to a gate electrode of an MOS field effect transistor formed on another part of the silicon substrate. The amplified voltage by the MOS field effect transistor is used as an electrical signal for further processing.

The different conductivity region is formed across the channel region and contacts the high impurity concentration field region. This contact and the contact with the substrate accompany a large capacitance to the different conductivity region. Here, the quantity of received charges is changed into a voltage value in accordance with an equation of $Q = C \cdot V$ where Q, C and V are respectively quantity of charges, capacitance and voltage. Thus, due to the large capacitance, the different conductivity region converts the quantity of charges to a small voltage.

SUMMARY OF THE INVENTION

It is a primary object of the present invention to provide a charge coupled device which has a high transfer efficiency and which produces an output voltage with a large value.

According to the present invention, there is provided a buried channel charge coupled device including a semiconductor substrate of a first conductivity type, a channel region of a second conductivity type opposite the first conductivity type formed in a surface region of the semiconductor substrate, a high concentration region of the first conductivity type formed in the surface region of the semiconductor substrate to surround a surface of the channel region, means formed on the channel region for transferring charges along the channel region, and a charge-voltage converting region formed in the surface region at an end of the channel region to receive charges transferred along the channel region and to convert the quantity of received charges to an output voltage, the charge-voltage converting region having a high concentration portion of the second conductivity type and low concentration portions of the second conductivity type disposed respectively between both sides of the high concentration portion and the high concentration region, and means for deriving the converted voltage from the high concentration portion of the charge-voltage converting region.

The charge coupled device of the present invention is of the buried channel type. Therefore, the channel region and the low concentration portion can be made by a single impurity diffusion process. The addition of the charge-voltage converting region of the present invention does not increase the manufacturing process. The charges are transferred in the channel region, resulting in a high transfer efficiency. The high concentration portion of the charge-voltage converting region does not contact the high concentration region. Rather, the high concentration portion contacts the substrate of low concentration region and the low concentration portion which then contacts the high concentration region. Therefore, any large capacitance accompanies to the charge-voltage converting region, causing a generation of high converted voltage.

BRIEF DESCRIPTION OF THE DRAWING

The above and further object, features and advantages of the present invention will become more apparent from the following detailed description taken in conjunction with the accompanying drawings, wherein.

Figure 1A:
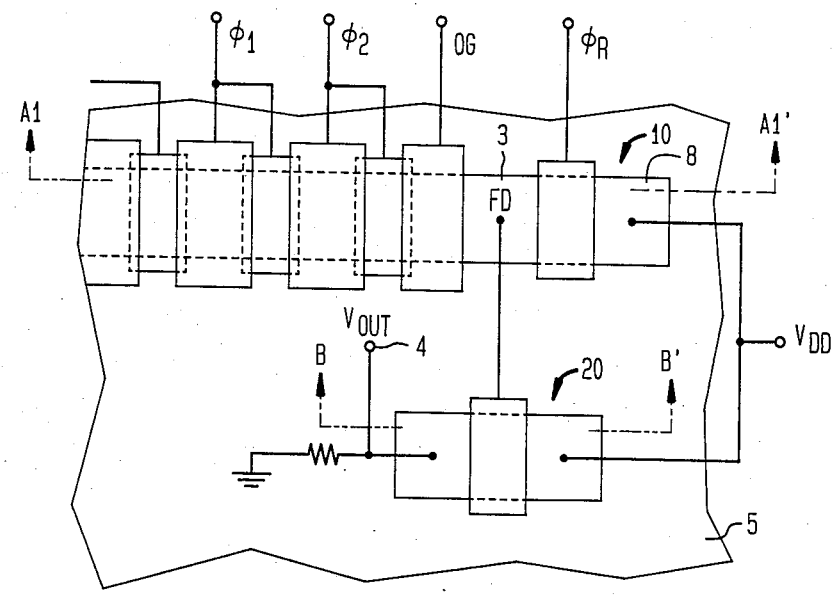
FIGS. 1(a) and 1(b) show a charge coupled device in the prior art, FIG. 1(a) being a plan view and FIG. 1(b) being sectional views taken along the lines A1–A1' and B1–B1'.
Figure 1B:
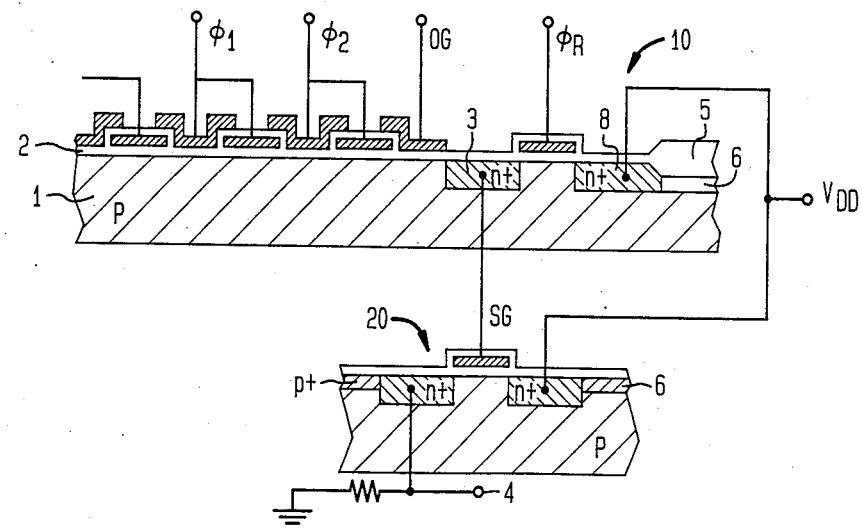

The charge coupled device in the prior art is formed, as shown in FIGS. 1(a) and 1(b), in a silicon substrate 1 of P-type having a P+-type region 6 at the surface region as a channel stopper on which a thick oxide film 5 is formed. The P+-type region 6 does not exist at channel region at which the substrate 1 is exposed at its surface. A plurality of gates 2 are formed on the channel region via a thin oxide film to transfer charges in response to an application of clock pulses $\phi_1$ and $\phi_2$. The clock pulses $\phi_1$ and $\phi_2$ are alternately applied to every two gates 2. The thickness of the thin oxide film is thicker under the left one of the every two gates 2 than that under the other, otherwise the impurity concentration under the left one of the every two gates 2 is arranged to be higher than that under the other. The final stage gate is an output gate OG applied a constant voltage. Adjacent to the ouput gate OG, an electrically floating region 3 of N+-type is formed. This floating region 3 receives charges transferred along the channel region to convert the quantity of charges to a voltage form signal. A reset gate is adjacent to the floating region 3 and formed on the surface of the substrate 1 via a thin oxide film. An N+-type region 8 is formed to provide a discharging MOS FET 10 with the floating region 3 and the reset gate. The N+-type region 8 is connected to receive a power voltage $V_{DD}$.

The converted voltage by the floating region 3 is too small to use for further processing. A detecting MOS FET 20 is formed in another portion of the substrate 1. The detecting MOS FET 20 is constructed by two N+-type regions and a signal gate SG disposed between the two N+-type regions via a thin oxide film. One of the N+-type regions receives the power voltage $V_{DD}$. The signal gate SG is connected with the floating region 3. The other of the N+-type regions is grounded through a resistor. An output signal is derived from an output terminal 4 which is connected with a junction of the other N+-type region and the resistor.

Figure 2A:
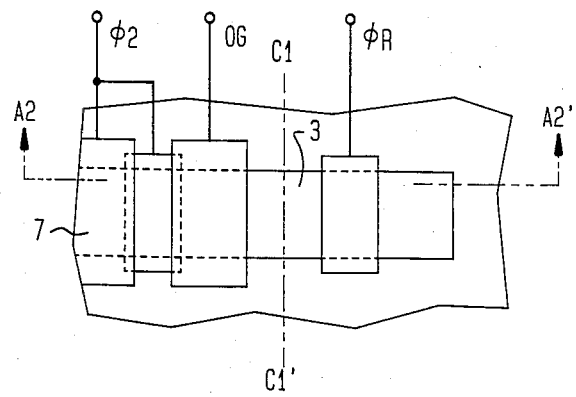
FIGS. 2(a), 2(b) and 2(c) show an essential part of the charge coupled device of FIGS. 1(a) and 1(b), FIG. 2(a) being a plan view of end portion of channel region, FIG. 2(b) being a sectional view taking a line A2–A2' of FIG. 2(a), FIG. 2(c) being a sectional view taking a line C1–C1' of FIG. 2(a)
Figure 2B:
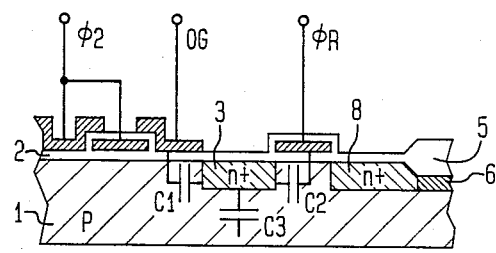
Figure 2C:
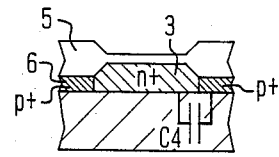

FIGS. 2(a), 2(b) and 2(c) show an essential part of the charge coupled device in the prior art of FIGS. 1(a) and 1(b). The floating region 3 contacts the P+-type region 6 at both sides and the substrate 1 at bottom. Therefore, large junction capacitances $C_4$ and another junction capacitance $C_3$ exist at both sides and at bottom of the floating region 3, respectively. Although further capacitances $C_1$ and $C_2$ exist between the output gate OG and the floating region 3 and between the reset gate and the floating region 3, these capacitances $C_1$ and $C_2$ are negligible in comparison with the junction capacitances $C_3$ and $C_4$.

Here, the floating region 3 converts the quantity of charges to voltage form in accordance with an equation (1);

$$V = Q/(C_3 + 2 \cdot C_4) \qquad (1)$$

where V is a converted voltage and Q is a quantity of transferred charges.

The junction capacitances $C_4$ are large because it is generated by high concentration junction between the N+-type floating region 3 and the P+-type region 6. Therefore, the converted voltage cannot be made large.

The charge coupled device in the prior art as above explained is a surface channel type in which charges are transferred through surface of the channel region. There are many surface states at the surface of the channel region. The surface states reduce charges by recombinations, resulting in poor transfer efficiency.

DESCRIPTION OF THE PREFERRED EMBODIMENT

Figure 3A:
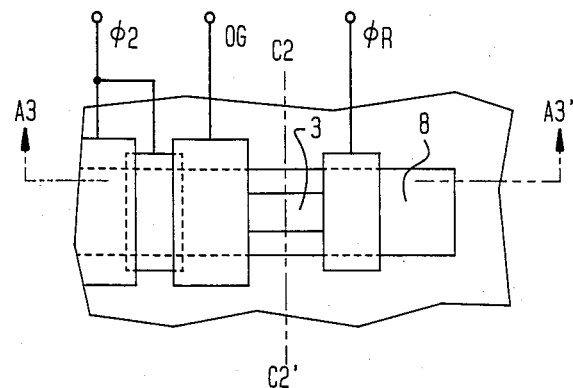
FIGS. 3(a), 3(b) and 3(c) show a preferred embodiment of the invention, FIG. 3(a) being a plan view of the essential part of the preferred embodiment, FIG. 3(b) being a sectional view taking along A3–A3' of FIG. 3(a) and FIG. 3(c) being a sectional view taking along C2–C2' of FIG. 3(a).
Figure 3B:
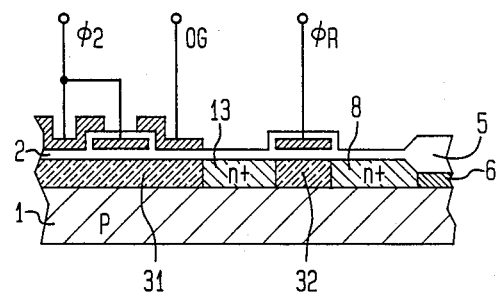
Figure 3C:
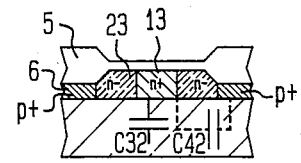

The essential part of the charge coupled device according to the present invention is shown in FIGS. 3(a), 3(b) and 3(c). The same reference numerals are used to refer to the equivalent parts of the prior art charge coupled device of FIGS. 1(a), 1(b), 2(a), 2(b) and 2(c). A P-type Si substrate 1 having an impurity concentration of $1 \times 10^{15}$ cm$^{-3}$ is used. Channel regions 31 and 32 are formed with a depth of 0.6 μm and a width of 10 μm by diffusing N-type impurities. The impurity concentration of the channel regions 31 and 32 are selected between $10^{16} \sim 5 \times 10^{17}$ cm$^{-3}$, and preferably selected at $4 \times 10^{16}$ cm$^{-3}$. The N-type impurities are diffused to form a low concentration portion 23 of the charge-voltage converting region at the same process as the diffusion process for the channel region 31.

The N-type impurities are further diffused to form a high concentration portion 13 of the charge-voltage converting region and an N+-type region 8 with an impurity concentration between $10^{20} \sim 10^{22}$ cm$^{-3}$, preferably $1 \times 10^{21}$ cm$^{-3}$, and a depth of 0.6 μm. The high concentration portion 13 has a width of 3 μm and a length of 11 μm. The width of the high concentration portion 13 is selected more than 1 μm.

The surface region surrounding the portion including the channel regions 31 and 32, the charge-voltage converting region (portions 13 and 23) and the N+-type region 8 is converted to P+-type region 6 as a channel stopper region by a P-type impurity diffusion with a concentration of $2 \times 10^{17}$ cm$^{-3}$. The P+-type region 6 has a depth of 0.4 μm.

A thick oxide film 5 having a thickness of 0.8 μm is formed on the P+-type region 6. A thin oxide film 2 is formed on the channel regions 31 and 32. A plurality of gates are formed on the thin oxide film 2 with phosphorus doped polycrystalline silicon. The gate on the channel region 32 is a reset gate. Every two gates receives alternatively clocks $\phi_1$ and $\phi_2$. The final gate on the channel region 31 is an output gate OG held at a constant voltage. The thickness of the thin oxide film 2 under the reset gate, the output gate and the right one of the every two gates is 1000 Å and is thinner than that under the left one of the every two gates. Alternatively, the impurity concentration of the channel region 31 under the left one of every two gates may be made higher than that under the right one of the every two gates, while all the thin oxide film 2 is made constant thickness of 1000 Å.

The charges are transferred along the depletion layer between the channel region 31 and the substrate 1 in response to the clocks $\phi_1$ and $\phi_2$ and introduced into the high concentration portion 13 in the charge-voltage converting region to convert the quantity of the transferred charges to a voltage signal. After the voltage signal is derived from the high concentration portion 13, the charges are drained through the N+-type region 8 held at a power voltage $V_{DD}$, in response to an application of a reset pulse $\phi_R$ to the reset gate. The high concentration portion 13, the reset gate and the N+-type region 8 constitutes a discharging MOS FET.

A detecting MOS FET and a load resistor may be formed at another surface portion of the substrate 1 with the same structure of the detecting MOS FET shown in FIGS. 1(a) and 1(b). This detecting MOS FET may be, of cause, omitted, if the charge-voltage converter can produce an output signal having a sufficiently high voltage.

The high concentration portion 13 faces the P+-type region 6 through the low concentration 23 and has a small stray capacitance. The bottom area of the high concentration portion 13 is small by the fact of decreased width. Thus, the high concentration portion 13 has a smaller stray capacitance of 0.018 pF than that of the prior art charge-voltage converting region 3 which is 0.025 pF. Then, the high concentration region 13 can produce a high voltage output of 1.38 V (here, a conversion gain is 0.75) and is higher than the prior art output voltage of 1.0 V (a conversion gain is 0.75).

As mentioned previously, the charges are transferred through a depletion layer between the channel region 31 and the substrate 1 and are not affected from the surface states. The disappearing rate of the transferring charges is thus small. In other words, the transfer efficiency of the charge coupled device of FIGS. 3(a), 3(b) and 3(c) is excellent. The low concentration portion 23 may be formed at the same process for forming the channel region 31, resulting in no increment of manufacturing process.

As above-mentioned, the charge coupled device according to the present invention produces a high voltage output and a high charge transfer efficiency. It is needless to say that the present invention is not limited to the preferred embodiment and may apply many modifications without departing from the spirit of the present invention. For example, the conductivity type of the channel region 32 may be P-type.

What is claimed is:

1. A charge coupled device comprising a semiconductor substrate of a first conductivity type, a channel region of a second conductivity type provided opposite the first conductivity type, a means formed on said channel region for transferring charges through said channel region, an output gate formed on one end portion of said channel region through an insulator film, a first high concentration region of said second conductivity type formed in contact with said end portion of said channel region to receive said charges transferred by said transferring means from said end portion, a first low concentration region of said second conductivity type provided on one side of said first high concentration region, a second low concentration region of said second conductivity type provided on the side of said high concentration region opposite said first low concentration region, said channel region, said first high concentration region and said first and second low concentration regions having substantially the same depth, a charge drain region formed in contact with said first high concentration region to drain charges in said first high concentration region in response to a reset pulse, a channel stopper region having high concentration impurities of said first conductivity type and formed at the surface of said semiconductor substrate to surround said channel region, said first and second low concentration regions and said charge drain region, said channel stopper region being separated from said first high concentration region by said first and second low concentration regions, said channel stopper region contacting said semiconductor substrate at a depth greater than each of said channel region, said first high concentration region and said first and second low concentration regions, and a means for generating an output by converting a quantity of charges in said first high concentration region into a voltage form.

2. A charge coupled device as claimed in claim 1, wherein the impurity concentration of said first high concentration region is in the range between $10^{20}$ and $10^{22}$ cm$^{-3}$ and the impurity concentrations of said first and second low concentration regions are in the range between $10^{16}$ and $5 \times 10^{17}$ cm$^{-3}$.

3. A charge coupled device as claimed in claim 1, wherein said charge drain region includes an additional channel region of said second conductivity type which contacts said first high concentration region, a second high concentration region of said second conductivity type formed in contact with said additional channel region and held at a constant voltage, and a reset gate formed upon said additional channel region, said reset gate receiving said reset pulse to drain charges from said first high concentration region.

4. A charge coupled device as claimed in claim 3, wherein said output generating means includes a series connection of a detecting MOS field effect transistor and a load resistor, a gate electrode of said detecting MOS field effect transistor being connected to said first high concentration region, and an output terminal connected to a junction point of said detecting MOS field effect transistor and said load resistor.

* * * * *